(12) United States Patent
Elkhatib et al.

(10) Patent No.: US 10,616,519 B2
(45) Date of Patent: *Apr. 7, 2020

(54) GLOBAL SHUTTER PIXEL STRUCTURES WITH SHARED TRANSFER GATES

(71) Applicant: Microsoft Technology Licensing, LLC, Redmond, WA (US)

(72) Inventors: Tamer Elkhatib, San Jose, CA (US); Cyrus Soli Bamji, Fremont, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 483 days.

This patent is subject to a terminal disclaimer.

(21) Appl. No.: 15/385,373

(22) Filed: Dec. 20, 2016

(65) Prior Publication Data

US 2018/0176498 A1    Jun. 21, 2018

(51) Int. Cl.
*G01C 3/08* (2006.01)
*H04N 5/3745* (2011.01)
(Continued)

(52) U.S. Cl.
CPC ....... *H04N 5/37452* (2013.01); *G01S 7/4816* (2013.01); *G01S 7/4915* (2013.01);
(Continued)

(58) Field of Classification Search
CPC ...... G01S 7/4915; G01S 7/4816; G01S 17/89; H04N 5/37452; H04N 5/363;
(Continued)

(56) References Cited

U.S. PATENT DOCUMENTS 6,101,232 A    8/2000   Fossum et al.
6,184,055 B1    2/2001   Yang et al.
(Continued)

FOREIGN PATENT DOCUMENTS

EP    0757476 A2    2/1997
EP    1917800 A1    5/2008
(Continued)

OTHER PUBLICATIONS

"International Search Report and Written Opinion Issued in PCT Application No. PCT/US2017/065936", dated Mar. 8, 2018, 15 pages.
(Continued)

*Primary Examiner* — Mark Hellner

(57) ABSTRACT

Pixel arrangements in time-of-flight sensors or other imaging sensors are presented that include a sensing element configured to accumulate charges related to incident light, and two transfer gates proximate to the sensing element and configured to selectively control transfer of the charges in the pixel arrangement. During an integration phase, a charge storage element for a global shutter stores first charges received from the sensing element based on activation of a first transfer gate and inactivation of a second transfer gate. During a reset phase, a diffusion node receives second charges received from the sensing element based on inactivation of the first transfer gate and activation of the second transfer gate. During a pixel readout phase, the diffusion node receives the first charges received from the charge storage element based on activation of the first transfer gate and activation of the second transfer gate.

20 Claims, 7 Drawing Sheets

(51) Int. Cl.
| | |
|---|---|
| H04N 5/33 | (2006.01) |
| H04N 5/363 | (2011.01) |
| H04N 5/357 | (2011.01) |
| H04N 5/347 | (2011.01) |
| H01L 27/146 | (2006.01) |
| H04N 13/271 | (2018.01) |
| G01S 17/36 | (2006.01) |
| H04N 5/369 | (2011.01) |
| G01S 17/89 | (2020.01) |
| G01S 7/4915 | (2020.01) |
| G01S 7/481 | (2006.01) |

(52) U.S. Cl.
CPC .............. *G01S 17/36* (2013.01); *G01S 17/89* (2013.01); *H01L 27/14603* (2013.01); *H01L 27/14609* (2013.01); *H01L 27/14612* (2013.01); *H01L 27/14641* (2013.01); *H04N 5/332* (2013.01); *H04N 5/347* (2013.01); *H04N 5/3575* (2013.01); *H04N 5/363* (2013.01); *H04N 5/3696* (2013.01); *H04N 5/37457* (2013.01); *H04N 13/271* (2018.05)

(58) Field of Classification Search
CPC .. H04N 5/3575; H04N 5/37457; H04N 5/347; H04N 5/3696; H04N 5/332; H04N 13/271; H01L 27/14609; H01L 27/14612; H01L 27/14603; H01L 27/14641
USPC ........................................................ 356/5.01
See application file for complete search history.

(56) References Cited

U.S. PATENT DOCUMENTS

| | | | |
|---|---|---|---|
| 6,222,175 | B1 | 4/2001 | Krymski |
| 6,483,129 | B2 | 11/2002 | Rhodes et al. |
| 6,727,486 | B2 | 4/2004 | Choi |
| 6,756,616 | B2 | 6/2004 | Rhodes |
| 7,321,111 | B2 | 1/2008 | Bamji et al. |
| 7,352,454 | B2 | 4/2008 | Bamji et al. |
| 7,524,717 | B2 | 4/2009 | Park et al. |
| 7,675,561 | B2 | 3/2010 | Lepage |
| 7,705,900 | B2 | 4/2010 | Guidash |
| 7,843,029 | B2 | 11/2010 | Kawahito et al. |
| 8,471,938 | B2 | 6/2013 | Altice et al. |
| 8,637,800 | B2 | 1/2014 | Kozlowski |
| 9,052,382 | B2 | 6/2015 | Bamji et al. |
| 9,287,304 | B2 | 3/2016 | Park et al. |
| 2004/0251482 | A1 | 12/2004 | Rhodes |
| 2006/0027730 | A1 | 2/2006 | Bamji et al. |
| 2007/0158770 | A1 | 7/2007 | Kawahito |
| 2008/0079833 | A1 | 4/2008 | Ichikawa et al. |
| 2010/0188491 | A1 | 7/2010 | Shizukuishi |
| 2011/0037969 | A1 | 2/2011 | Spickermann et al. |
| 2012/0181650 | A1 | 7/2012 | Mase et al. |
| 2012/0205723 | A1 | 8/2012 | Suzuki et al. |
| 2013/0020463 | A1 | 1/2013 | Lee et al. |
| 2013/0181119 | A1 | 7/2013 | Bikumandla et al. |
| 2013/0292548 | A1 | 11/2013 | Agranov et al. |
| 2014/0077062 | A1 | 3/2014 | Hynecek |
| 2014/0198183 | A1 | 7/2014 | Kim et al. |
| 2014/0300700 | A1 | 10/2014 | Bamji et al. |
| 2014/0375979 | A1 | 12/2014 | Oh et al. |
| 2016/0150175 | A1 | 5/2016 | Hynecek |
| 2016/0165160 | A1 | 6/2016 | Hseih et al. |
| 2016/0225812 | A1 | 8/2016 | Elkhatib et al. |
| 2017/0338274 | A1* | 11/2017 | Gancarz ................. G01S 17/89 |
| 2018/0176492 | A1 | 6/2018 | Bamji et al. |
| 2019/0086519 | A1* | 3/2019 | Roy ....................... G01S 7/4914 |
| 2019/0335124 | A1 | 10/2019 | Bamji et al. |

FOREIGN PATENT DOCUMENTS

| | | |
|---|---|---|
| EP | 2148514 A1 | 1/2010 |
| EP | 2453649 A2 | 5/2012 |
| EP | 2541275 A1 | 1/2013 |
| WO | 2006012761 A1 | 2/2006 |

OTHER PUBLICATIONS

Kwon, et al., "A Fully-Differential Correlated Doubling Sampling Readout Circuit for Mutual-capacitance Touch Screens", In Journal of Semiconductor Technology and Science, vol. 15, No. 3, Jun. 2015, pp. 349-355.

Kim, et al., "A High Speed CMOS Image Sensor with a Novel Digital Correlated Double Sampling and a Differential Difference Amplifier", In Journal of Sensors, vol. 15, Issue 3, Mar. 2015, pp. 5081-5095.

Ramachandra Rao, Padmakumar., "Charge-Transfer CMOS Image Sensors: Device and Radiation Aspects", In Thesis of Delft University of Technology, May 18, 2009, 195 pages.

Heuberger, et al., "Microelectronic Systems: Circuits, Systems and Applications", In publication of springer, Jan. 1, 2011, 361 pages.

Stoppa, et al., "Time of Flight Image Sensors in 0.18μm CMOS Technology: a Comparative Overview of Different Approaches", In Proceedings of International Image Sensor Workshop, Jun. 2011, 4 pages.

Meynants, Guy, "Global shutter image sensors", http://electroiq.com/blog/2014/09/global-shutter-image-sensors/, Published on: Sep. 2014, 10 pages.

U.S. Appl. No. 14/788,224, Bamji, et al., "An Enhanced Modulation Contrast CMOS Three-Dimensional Image Sensor Detectors Which is Robust for Interfacial Traps Charges and Other Fabrication Induced Fixed Changes", Filed Date: Jun. 30, 2015.

Stefan Lauxtermann et al. "Comparison of global shutter pixels for CMOS image sensors," in proc. of International image sensor workshop, Jun. 2007, pp. 82-85.

Ge, Xiaoliang, "The Design of a Global Shutter CMOS Image Sensor in 110nm Technology", in Master Thesis of Delft University of Technology, Aug. 21, 2012, pages.

"Archive for Feb. 2012", In Journal of IEEE International Solid-State Circuits Conference, Feb. 28, 2012, 8 pages.

Krymski, Alex, "Global Shutter Pixel with Floating Storage Gate", In Proceedings of IEEE International Image Sensor Workshop, Jun. 2013, 4 pages.

Stefanov, et al., "A Global Shutter CMOS Image Sensor for Hyperspectral Imaging", In Proceedings of SPIE, Society of Photo-Optical Instrumentation Engineers, Aug. 2015, 12 pages.

Wan, et al., "CMOS Image Sensors with Multi-Bucket Pixels for Computational Photography", In Journal of IEEE Journal of Solid-State Circuits, vol. 47, No. 4, Apr. 2012, pp. 1031-1042.

Tadmor, et al., "A High QE, Fast Shuttered CMOS Image Sensor with a Vertical Overflow Drain Shutter Mechanism", In Proceedings of International Image Sensor Workshop, Jun. 8, 2015, 4 pages.

"International Search Report and Written Opinion Issued in PCT Application No. PCT/US17/065935", dated Apr. 5, 2018, 13 Pages.

"Non Final Office Action Issued in U.S. Appl. No. 16/503,896", dated Jul. 26, 2019, 21 Pages.

"Notice of Allowance Issued in U.S. Appl. No. 15/385,198", dated Apr. 4, 2019, 15 Pages.

* cited by examiner

GLOBAL SHUTTER PIXEL STRUCTURES WITH SHARED TRANSFER GATES

BACKGROUND

Digital imaging sensors are employed in many devices and systems to capture images, such as in digital cameras. Imaging sensors employ large semiconductor arrays of detection pixels that can comprise charge-coupled devices (CCDs) or complementary metal oxide semiconductor (CMOS) devices, among others. The imaging sensors can be configured to capture a range of the electromagnetic spectrum that spans both visible light and infrared light ranges. Further types of imaging sensors are employed in time of flight (TOF or ToF) cameras that measure a depth of a scene using emission of light precisely timed to measurement or detection by an imaging sensor. Many ToF systems use differential pixel structures within an integrated array of differential pixels that can detect incident light during associated detection phases. These ToF cameras can be employed in applications where identifying relative depths among objects in a scene is useful, such as interactive gaming devices, virtual reality devices, augmented reality devices, industrial controls, medical scanners, or other devices.

OVERVIEW

Pixel arrangements in time-of-flight sensors or other imaging sensors are presented that include a sensing element configured to accumulate charges related to incident light, and two transfer gates proximate to the sensing element and configured to selectively control transfer of the charges in the pixel arrangement. During an integration phase, a charge storage element for a global shutter stores first ones of the charges received from the sensing element based on activation of a first transfer gate and inactivation of a second transfer gate. During a reset phase, a diffusion node receives second ones of the charges received from the sensing element based on inactivation of the first transfer gate and activation of the second transfer gate. During a pixel readout phase, the diffusion node receives the first ones of the charges received from the charge storage element based on activation of the first transfer gate and activation of the second transfer gate.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

TECHNICAL DISCLOSURE

Figure 1:
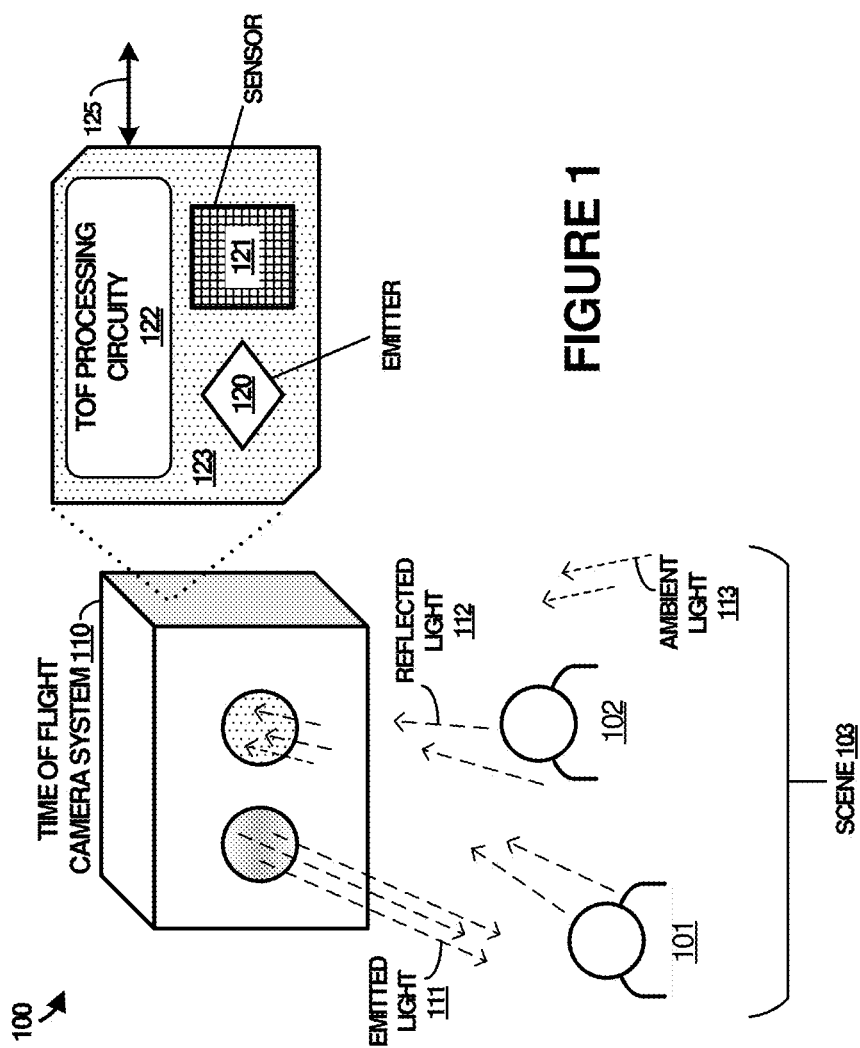
FIG. 1 illustrates a time of flight camera environment in an implementation.

Imaging sensors, such as visible red-green-blue (RGB) wavelength imaging sensors, infrared imaging sensors, two-dimensional (2D) imaging sensors, and time-of-flight (ToF) based three-dimensional (3D) imaging sensors, have found several applications in consumer products, smartphones, gaming systems, industrial automation, medical imaging, automotive driving assistance, scientific imaging, virtual reality systems, augmented reality systems, as well as other related areas. ToF sensing devices share some aspects of visible or infrared wavelength sensors, such as RGB imaging sensors, but also have some unique characteristics. For example, ToF sensors can deliver depth information of 3D images by using precisely timed active illumination for measurement, as well as specialized differential pixel structures. Continuous-wave phase modulated ToF detectors have complex operations that include multi-phases and multi-frequencies to capture a single depth image estimation. Although ToF systems can employ various wavelengths of light, in many of the examples herein infrared (IR) light will be discussed. It should be understood that other wavelengths of light can be employed.

There is an industry drive to decrease the size of semiconductor sensors that can detect infrared or visible light. Demand for high resolution (i.e. more pixels per unit area) image sensors and ToF sensors are increasing due to emerging products such as motion sensing input devices, augmented reality devices, and virtual reality devices. In addition to resolution concerns, sizes of associated imaging sensors have also decreased to reduce physical packaging constraints and reduce power consumption. As imaging sensors of various types are decreased in size, these size reductions are sometimes achieved by lower feature size of the individual structures formed onto the semiconductor substrates. However, feature size reduction can hit limitations due to manufacturability issues as well minimum size requirements of the sensing structures used to sense light, especially in differential structures used in ToF sensors where many more transistors are typically employed per pixel. In the examples herein, various enhanced imaging sensors and pixel arrangements are discussed which can be employed in ToF camera systems. However, it should be understood that although many differential pixel ToF examples are discussed below, non-differential pixel imaging arrays (such as RGB imaging sensors and infrared imaging sensors) can also employ the enhancements discussed herein. Pixel array architectures and timing methods are discussed to overcome problems in reducing sizes and complexity of imaging sensors that also reduce system cost and power consumption.

When a pixel of an imaging sensor is reset there can be an uncertainty in the final reset voltage of the pixel. The voltage uncertainty to which the pixel is reset prior to an integration stage can be shown to be uncertainty $$= \sqrt{\frac{kT}{C}},$$

where C is the readout capacitance of the pixel, k is the Boltzmann constant, and T is the absolute temperature of the imaging sensor measured in Kelvin. This uncertainty called "kTC noise" can give rise to noise in captured images because the final value read from the pixel is the sum of collected charge and the initial reset value. Also, the uncertainty grows as pixels shrink and C becomes smaller. Small pixel sizes can suffer from high kTC noise because of small associated readout capacitances. To improve uncertainty caused by kTC noise, Correlated Double Sampling (CDS) techniques can be employed in image sensors. However, CDS techniques increase complexity and power consumption for image sensors, especially in ToF sensors.

To reduce kTC noise, circuitry is typically employed subtract a reset voltage from an integration voltage stored in a temporary storage element to establish a compensated result that at least partially reduces readout voltage uncertainty of an associated pixel arrangement. The reset voltage (V) of the pixel ($V_{reset}$) is measured after the pixel is reset. After an integration process that collects charge related to captured light, a value $V_{integration}$ is present on the pixel. The signal integrated by the pixel can be then determined by $V_{signal} = V_{integration} - V_{reset}$.

In some examples, digital domain circuitry is employed to reduce the readout voltage uncertainty (e.g. kTC noise) in the digital domain by using extra analog-to-digital conversion (ADC) circuitry (for $V_{reset}$), and digital memory to store the digitized $V_{reset}$ value during the integration process. However, using the extra ADC circuitry can add complexity, subject the resultant pixel data to extra ADC or amplifier noise as well as to limitations in the dynamic range of any associated ADC circuit, in part because $V_{reset}$ can vary and consume differential dynamic range of associated circuitry. This process can be referred to as digital double correlated sampling (DDCS).

A global shutter pixel in an image sensor describes a pixel with additional voltage domain or charge domain global shutter storage elements, such as 'metal' capacitors, charge gates, or p-n junction nodes. A first pixel sample of the CDS operation can be stored in this additional global shutter storage element, then an additional second pixel sample can be subtracted in analog domain circuit in associated column amplifier circuitry of the pixel array. The examples herein incorporate global shutter storage elements into ToF pixels along with an enhanced transfer gate structure. Inclusion of a global shutter in the enhanced ToF pixels discussed herein can lead to significant reduction in integrated digital memory utilization and can reduce associated ADC power consumptions, while providing for high resolution ToF image sensors.

Typically, the structure of electro-optical (mixer) demodulation photodetector in ToF architectures employs many more gate structures than a standard non-ToF (active pixels) image sensor. One example differential ToF phase-demodulation detector (sometimes referred to as a quantum efficiency modulation detector) consists of 6T+2 additional transfer gates, which might be considered a considered an 8T pixel, where the 'T' designates a quantity of individual gate structures or polysilicon gate areas which control the flow of charges. Integration of a global shutter feature with ToF detectors can drive the part count up to 12T in global shutter ToF pixels (6T+6 transfer gates). If ambient light resilience features are included as well, such as anti-blooming features, then another two transfer gates are employed and at least another two additional n+ diffusion nodes. This configuration results in 14T pixels with at least two floating diffusion nodes, plus two n+ ($V_{dd}$) diffusion nodes. This large quantity of gate structures for a ToF pixel design can limit the development of smaller pixel and array sizes, and can add challenges on the high-performance efficiency of the pixels. In addition, the added gate structures in the pixels can require more horizontal and vertical metallization wiring for the added signals which lead to increased parasitic capacitance and power consumption, as well as complicate the pixel design and metallization routing.

Figure 6:
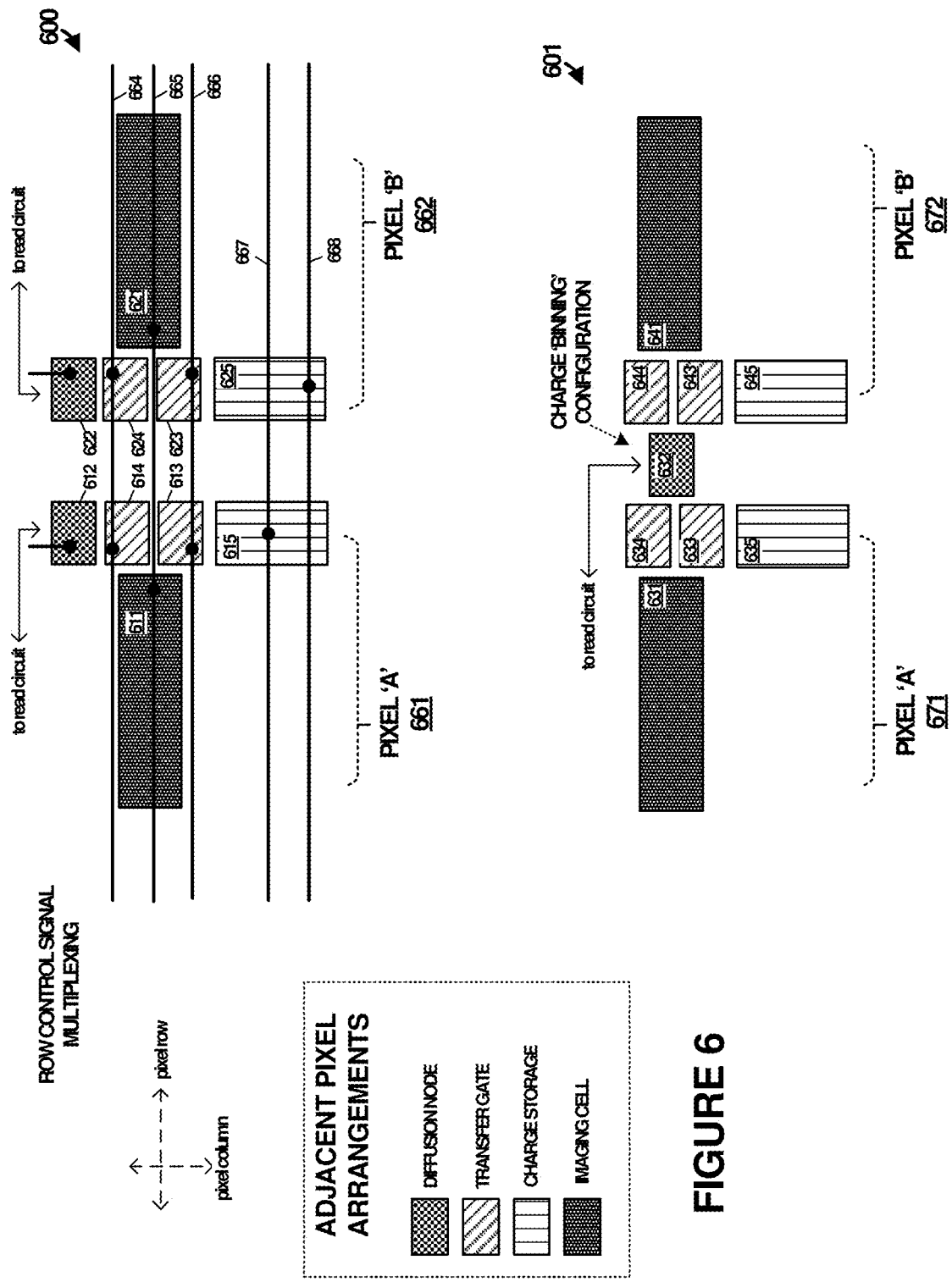
FIG. 6 illustrates top views of example pixel structures.

Advantageously, the pixel arrangements herein provide for global shutter (GS) ToF pixel structures with a reduced number of gate structures that also supports ambient resilience operations. The pixel arrangement can comprise 12T and only two floating diffusions instead of 14T and two floating diffusion nodes with two n+ diffusion nodes. The pixel arrangements herein can be implemented with various feature sizes, such as smaller than 5 μm×5 μm, with relatively high operation performance and a reduced number of metallization wiring per pixel. In addition, the pixel arrangements herein allow enhanced multiplexing of wiring between 'odd' and 'even' global shutter elements. For example, pixel arrays can have shared column amplifiers between two neighboring columns of pixels. Also, odd/even column multiplexing schemes can be enabled that allow 2-to-1 charge binning operation between two neighboring pixels for higher signal-to-noise (SNR) operations with minimized additional signaling or wiring in ToF image sensors. Examples of this multiplexing are seen in FIG. 6.

As a first example that can employ the enhanced pixel structures and ToF sensors discussed herein, FIG. 1 is presented. FIG. 1 is a system diagram illustrating ToF camera environment 100. Environment 100 includes time of flight camera system 110 and scene elements 101-102. A detailed view of ToF camera system 110 is shown including emitter 120, ToF sensor 121, and ToF processing circuitry 122 mounted on one or more circuit boards 123. ToF camera system 110 communicates with external systems over communication link 125. In some examples, elements of emitter 120 and image processing circuitry are included in sensor 121.

In operation, ToF camera system 110 emits light 111 using emitter 120 to illuminate elements in scene 103, such as scene elements 101-102. Light 111 reflects off objects and elements in scene 103 and is received as reflected light 112 by sensor 121. Sensor 121 might be configured to detect objects and elements in the scene illuminated by reflected light 112, or instead detect objects and elements in the scene illuminated by ambient light 113. Sensor 121 can detect light using an array of pixels on a semiconductor substrate of sensor 121.

Once the associated light is detected by sensor 121, pixel data representative of this detected light is provided to ToF processing circuitry 122 which processes the pixel data to determine one or more images, with at least one of the images comprising a depth map of the scene resultant from illumination. Sensor 121 can have an associated filtering element to allow detection of either IR light or selective portions of visible light.

Referring back to the elements of FIG. 1, emitter 120 can comprise one or more light emitters, such as light-emitting diodes (LEDs), laser emitters, laser diode emitters, or other components. Emitter 120 can also include various driver circuitry configured to provide power to emitter 120 and synchronize emission of light with timing signals provided by ToF processing circuitry 122.

Sensor 121 comprises an array of pixels formed on a semiconductor substrate, along with associated driver, power, and output circuitry. The individual pixels can incorporate techniques and semiconductor structures found in CCD pixels or CMOS pixels, among other semiconductor-based light detection techniques and elements. Further examples of sensor 121 will be discussed in FIGS. 3-7 herein.

Link 125 comprises one or more wired or wireless communication links for communicating with external systems, such as computing devices, microprocessors, servers, network devices, smartphone devices, or other processing systems. Link 125 can carry imaging data and related data, such determined by ToF camera system 110, or can carry commands and instructions transferred by an external control system. Link 125 can comprise a Universal Serial Bus (USB) interface, Peripheral Component Interconnect Express (PCIe) interface, wireless interface, IEEE 802.15 (Bluetooth) wireless link, IEEE 802.11 (WiFi) wireless link, Direct Media Interface (DMI), Ethernet interface, networking interface, serial interface, parallel data interface, or other communication or data interface, including combinations, variations, and improvements thereof.

Figure 2:
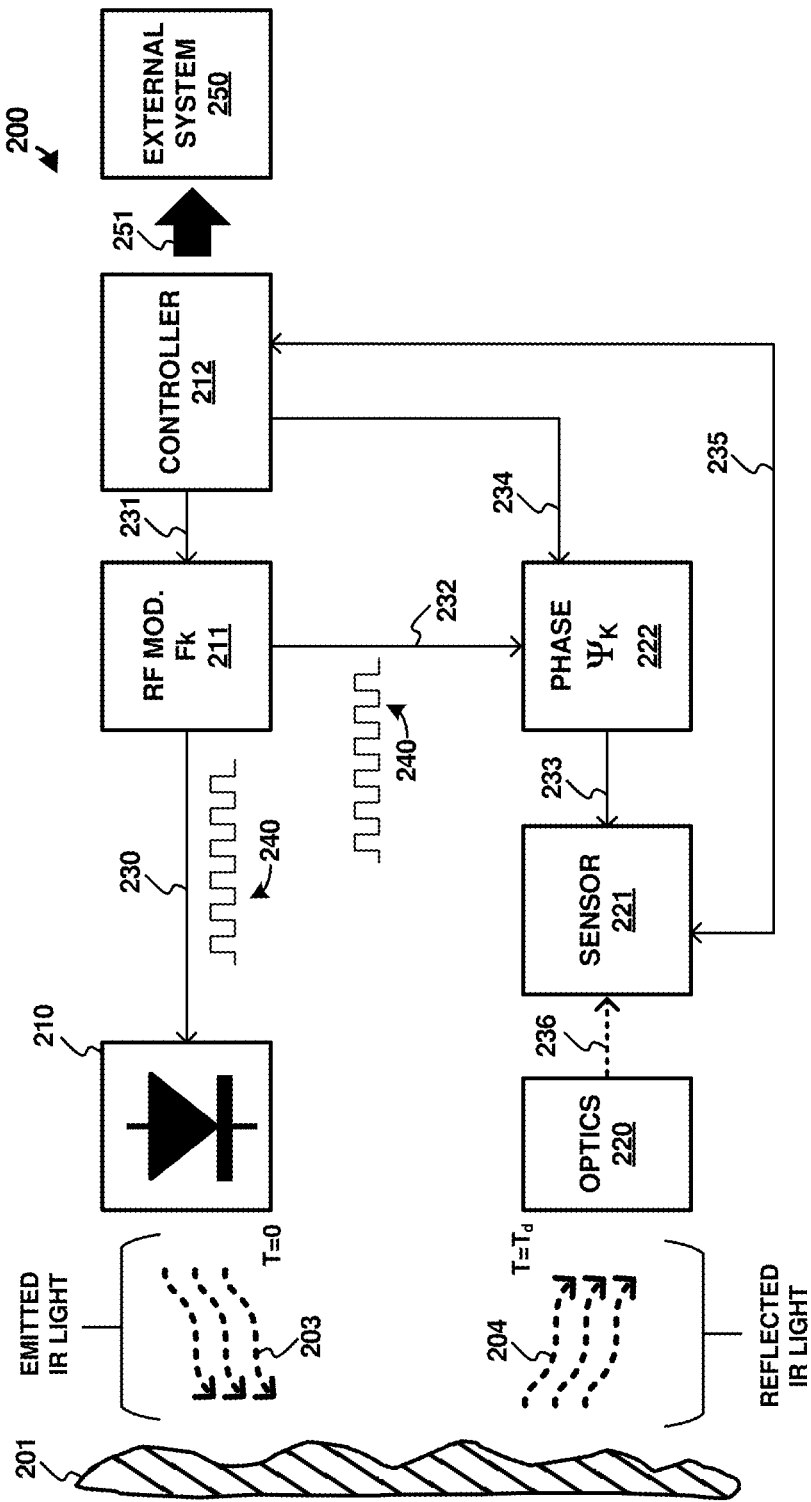
FIG. 2 illustrates a system diagram of a time of flight sensing system in an implementation.

To further illustrate the elements of FIG. 1 and provide a detailed view of one example ToF camera system, FIG. 2 is presented. FIG. 2 is a block diagram illustrating ToF sensing system 200. Elements of system 200 can be incorporated into elements of ToF camera system 110. FIG. 2 includes object of interest 201 within a scene which is imaged by system 200 to identify ToF information for at least object 201 and provide this information to external system 250 over communication link 251. The ToF information, such as a ToF signal, can comprise a signal proportional to a phase shift between emitted light pulses detected and a reference signal. The ToF signal can be used to determine distances to objects in a scene, such as object 201, from which emitted light was reflected. Although infrared light (IR) is discussed in FIG. 2, it should be understood that other suitable wavelengths of light can be employed.

System 200 includes IR emitter 210, radio frequency (RF) modulator 211, controller 212, optics 220, sensor 221, and phase module 222. RF modulator 211 comprises a system oscillator that generates RF modulation signal 240 and is controlled by controller 212 over link 231. RF modulation signal 240 is provided to IR emitter 210 over link 230 for emission as IR light 203. Emitted IR light 203 is modulated according to RF modulation signal 240 by IR emitter 210, and illuminates object 201.

Experiencing a time-of-flight time delay, the back scattered reflected IR light 203 is received by optics 220 and provided via optical path 236 onto sensor 221. Sensor 221 includes at least one pixel or one array of pixels. RF modulator 211 simultaneously transfers a reference signal as RF modulation signal 240 over link 232 to phase module 222. Phase module 222 is controlled by controller 212 over link 234. Phase module 222 demodulates pixel data received over 233 using RF modulation system 240 as a baseline for phase processing. Visible light detection may be provided by a visible light source and detector, which in some examples comprises ambient light detection.

Turning to the elements of FIG. 2, IR emitter 210 can comprise a light-emitting diode, diode laser, or other IR light emitter which can be modulated according to RF modulation signal 240. RF modulator 211 comprises various circuitry to generate an RF modulated signal based on control instructions from controller 212. RF modulator 211 can include crystal oscillators, clock generation circuitry, phase-locked loop (PLL) circuitry, or other modulation circuitry. Phase module 222 comprises a phase comparator circuit which can produce phase shifts between RF modulation signal 240 and a signal sent over link 233 from sensor 221 for use in determining a time-of-flight (ToF) signal. In some examples, RF modulator 211 and phase module 222 are combined into a single circuit module. Sensor 221 comprises an IR light sensor used for determining ToF information of object 201. Sensor 221 includes elements discussed herein for the various pixel arrays and pixel architectures. Optics 220 can comprise optical interfacing elements that can pass and focus at least IR light. Optics 220 can include prisms, optical adhesives, lenses, mirrors, diffusers, optical fibers, and the like, to optically couple incident light onto sensor 221. Links 230-235 can each comprise wired or wireless links to interconnect the associated modules of FIG. 2. When combined onto one or more printed circuit boards, links 230-235 can comprise printed circuit traces.

Controller 212 can include communication interfaces, network interfaces, processing systems, computer systems, microprocessors, storage systems, storage media, or some other processing devices or software systems, and can be distributed among multiple devices. Examples of controller 212 can include software such as an operating system, logs, databases, utilities, drivers, caching software, networking software, and other software stored on non-transitory computer-readable media. A further example of controller 212 is shown in FIG. 8. External system 250 can comprise a network device, computing device, gaming platform, virtual reality system, augmented reality system, or other device, including combinations thereof. System 200 can also include power supply circuitry and equipment, enclosures, chassis elements, or ventilation/cooling systems, among other elements not shown in FIG. 2 for clarity.

Figure 3:
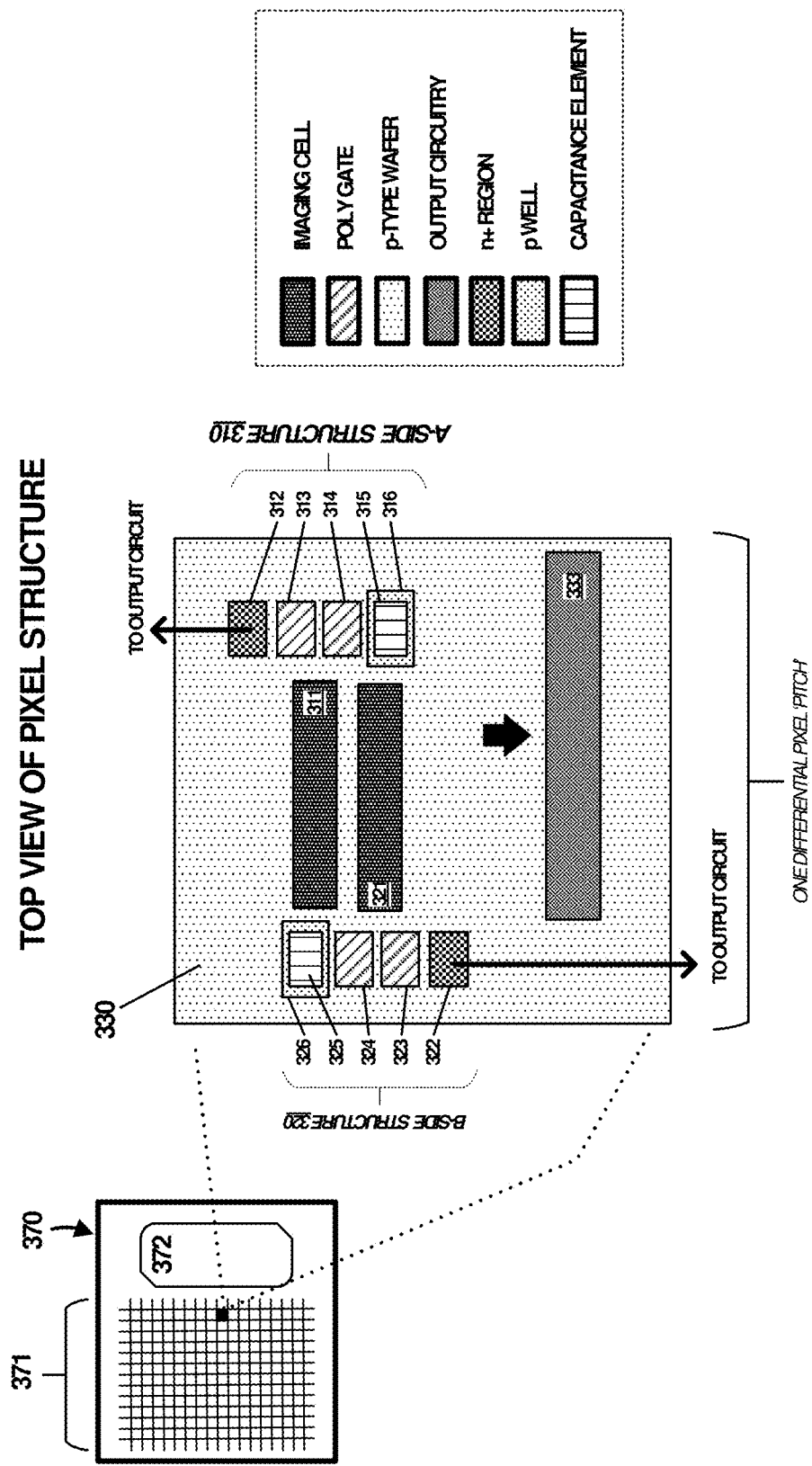
FIG. 3 illustrates a top view of a pixel structure in an implementation.
Figure 4:
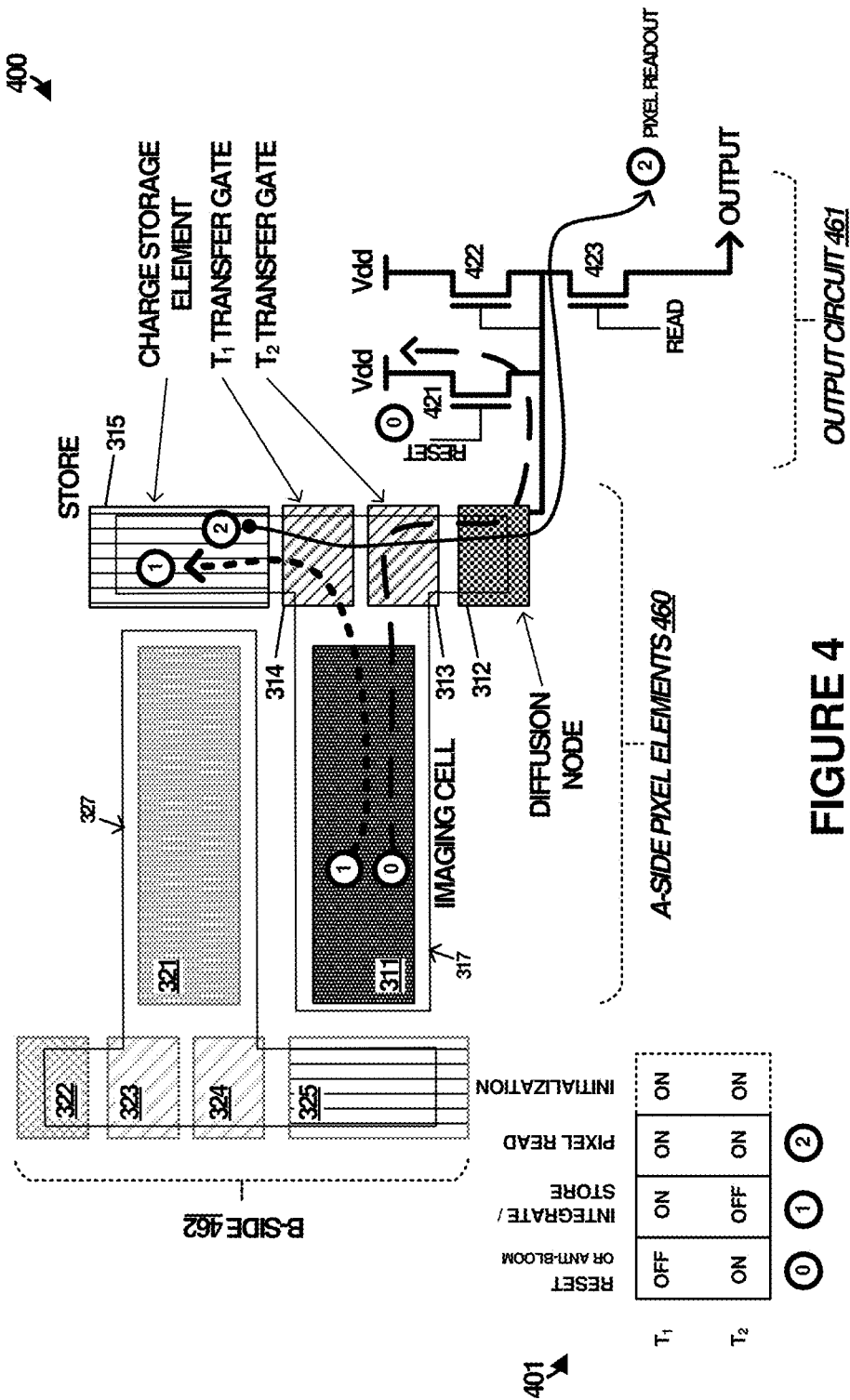
FIG. 4 illustrates a top view of a pixel structure in an implementation.
Figure 5:
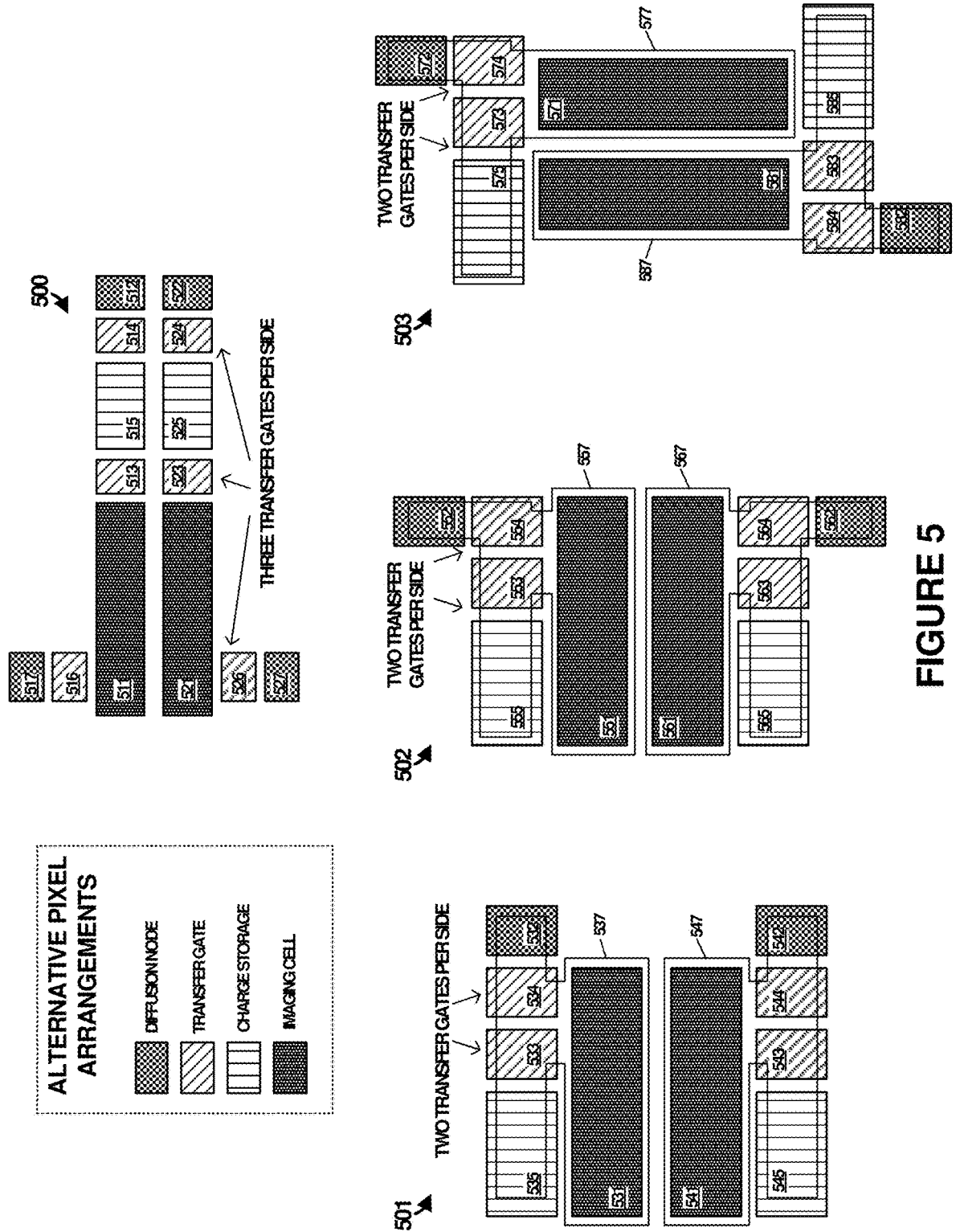
FIG. 5 illustrates top views of example pixel structures.

Turning now to FIGS. 3 and 4, these figures show example implementations of a shared transfer gate structure in various pixel arrangements. However, alternative arrangements can also be employed for a shared transfer gate structure. FIGS. 5 and 6 show several alternative arrangements. These arrangements can be employed in either differential ToF pixels or in single-ended non-ToF pixel configurations, including combinations thereof. Portions of the pixel arrangements in FIGS. 3-6 can be employed in single sided pixels, differential pixels, or multi-tap ToF pixels. Furthermore, although the pixel arrangements in FIGS. 3-6 include polysilicon finger gates as the light-sensing elements, pixels with other light sensing elements, such as pinned photodiodes, can be used with the shared transfer gates and charge storage arrangements herein for visible, RGB, infrared, or other sensing applications. Although the term 'imaging' is used herein, it should be understood that 'imaging' can refer to both 2D imaging and depth map detection sensors and sensing devices.

FIG. 3 illustrates a top view semiconductor topology for pixel structure 300. Pixel structure 300 illustrates one pixel 'pitch' which includes one differential pixel structure configured to sense light in ToF applications. Pixel structure 300 comprises a pixel structure that can be included in an array of many pixels to form an image sensor. For example, imaging sensor 370 is shown in FIG. 3 which includes pixel array 371 and pixel control circuitry 372. In FIG. 3, a top view is shown of pixel structure 300, which represents a single differential pixel structure area of imaging sensor 370.

The pixels in pixel structure 300 are configured to sense incident light propagating to the pixel structure from the top and into the figure. This example is referred to as front side illumination (FSI). Other configurations are possible with the pixels configured to sense incident light propagating to the pixel structure from the bottom and out from the figure, referred to as back side illumination (BSI). Associated light filtering components are positioned between light sources and the pixel, namely on the 'top' side in FSI examples, and on the 'back' side in BSI examples. Although FIG. 3 shows a differential ToF pixel structure, a similar arrangement for a non-differential pixel structure can be employed, such as in RGB imaging pixels or infrared imaging sensors. While polysilicon gates are often preferred as photodetector elements in ToF sensors, other photodetectors such as pinned photodiodes can be employed with the pixel arrangement described here in other types of pixel-based sensors. Not shown in FIG. 3 are various other structures and elements of an integrated imaging sensor, such as back end oxidation that substantially covers the pixel structure, among other elements omitted for clarity.

A semiconductor substrate is employed onto which various structures are formed using various lithography fabrication processes, such as etching, deposition, masking, diffusion, ion implantations, and the like. A semiconductor wafer is typically used as the substrate, which in this example is a p-type wafer labeled as 330 in FIG. 3. Although n-type wafers can be employed, the examples herein will focus on p-type wafers for clarity.

Pixel structure 300 comprises a differential pixel structure configured to sense light for time-of-flight techniques, or other applications. In one implementation of pixel structure 300, photo charges related to incident infrared light are collected in differential polysilicon fingers 311 and 321. Polysilicon fingers 311 and 321 are arranged and operated in a differential manner, with a first 'A-side' structure 310 and a second 'B-side' structure 320. Although not shown in FIG. 3, polysilicon fingers 311 and 321 can have shallow trench isolation (STI) barrier formed between both, and have p-type doping established underneath. Further examples of STI barriers are seen in FIGS. 4-5.

A-side 310 includes elements 311-316, and B-side 320 includes similar elements 321-326. Polysilicon fingers of the A-side of pixel array 371 are all modulated with a first clock, and polysilicon fingers of the B-side of pixel array 371 are all modulated with a second clock. Polysilicon fingers of the A-side and the B-side are typically oriented parallel to each other on a semiconductor substrate. FIGS. 3 and 4 show a 'parallel' orientation of side A and side B, while FIGS. 5 and 6 shows alternative layouts that might include parallel or anti-parallel orientations. The examples in FIG. 3 will focus on A-side element operations and structures, but it should be understood that similar operations and structures can be employed for the B-side elements.

Elements 311, 313, 314, 315, 321, 323, 324, and 325 each comprise structures with associated polysilicon (polycrystalline silicon) gates in this example. Elements 311, 313, 314, 315, 321, 323, 324, and 325 can comprise metal-oxide semiconductor (MOS) gates, where the 'metal' can be polysilicon or any suitable material. Associated gate oxide regions can be included underneath some or all of elements 311, 313, 314, 315, 321, 323, 324, and 325 of pixel structure 300, but are not shown in FIG. 3 for clarity. The gate oxides can be silicon dioxide or any suitable dielectric material. During manufacture of pixel structure 300, certain areas the surface of substrate 330 are typically p-doped, thus hampering charges from being transferred between polysilicon elements. Polysilicon gaps can be established to be small enough to be substantially protected by oxide polysilicon spacers during p-implantation if the implantation is after polysilicon deposition in the area of the gaps.

Individual pixels each comprise individual photodetectors, which can comprise active pixel sensor (CMOS) style pixels, photo sensitive diodes, photo gate diodes, or pined photodiodes, among other photodetectors. Pinned diodes or similar structures can be used to collect and store charges in visible light/RGB pixels. However, pinned diodes are not ideal for use in differential/ToF pixels. Instead, ToF pixels can employ special structures referred to as polysilicon finger gates are employed for collecting photo-charges related to incident light. Furthermore, to make sufficient space on a semiconductor substrate for an array of these polysilicon fingers, charge handling structures and charge storing structures should be in a more compact configuration than afforded by pinned diodes. For a differential pixel as described in FIG. 3, two such photo charge collection areas kept in electrical isolation are employed. The charges are established by incident light and stored as minority carriers under the associated polysilicon gate whose charge capacity per unit area is much larger than a pinned diode. In the example of FIG. 3, a very lightly doped p-type substrate is employed, so the minority carriers are electrons (negative charge) and the majority carriers are holes (positive charge).

Turning now to operations and elements of A-side structure 310, charges from polysilicon fingers 311 modulate between two voltages, such as predetermined high and low voltage levels. When an associated polysilicon finger 311 is driven to the high voltage level, charges are collected by the polysilicon finger 311 related to incident light, and when the polysilicon finger 311 is driven to the low voltage level, charge is transferred to a charge storage element for a global shutter, such as polysilicon charge storage element 315 shown in FIG. 3. However, charges once transferred to an associated charge storage element, such as charge storage element 315, should preferably not substantially return to polysilicon finger 311. To shuttle charge to charge storage element 315 and prevent substantial return of charge to polysilicon fingers 311 transfer gates 313 and 314 are employed. Transfer gates 313 and 314 can be used in pixel arrangement 300 to isolate the polysilicon fingers from associated floating diffusion element 312 used for readout. In a ToF system, charges are preferred to be established from incident light only by the polysilicon finger and not by a charge storage element which is driven to a relatively high voltage.

Charge storage element 315 can be formed from a MOS structure. This MOS structure might comprise a polysilicon or metallized gate structure. To further achieve this operation, charge storage element 315 is placed in a "p-well" 316 generally impenetrable to charges generated outside the p-well. Preferably p-well 316 is a lightly doped retrograde p-well whose doping is adjusted for this purpose. The 'p' dopant can hinder transfer of charges into charge storage element 315, however, this hindrance can be overcome by a higher potential/bias applied to charge storage element 315 and appropriate bias applied to at least transfer gate 313. Thus, p-well 316 receives charges via appropriate biasing of charge storage element 315 and selective activation of transfer gates 313-314, which allows charge storage element 315 to receive charges from the associated polysilicon finger 311.

The p-well underlying charge storage element 315 can comprise a p-type dopant well in semiconductor substrate 330, where the p-type dopant well comprises a higher p-type doping level than substrate 330. Other elements of pixel array 371 can be included in p-well structures, such as output circuitry 333, or transfer gates 313-314. P-well 316 can start in the gap area between the poly/gate regions that form transfer gates 313-314.

Global shutter operations in ToF pixels are provided by the structures in FIG. 3. Specifically, charge storage element 315 (and 325) provides for storage of integration charges received from polysilicon finger 311. All pixels of pixel array 371 can capture a scene at the same time, and associated photo charges are integrated and stored in associated charge storage elements until readout from the pixel. After the integration/capture process, charges in charge storage element 315 are ultimately digitized for use in ToF/imaging applications. However, before this digitization is performed, the charges accumulated by charge storage element 315 are first converted into a corresponding voltage, and then various corrections, correlations, or compensations can be performed on the resultant voltages. To generate a voltage from the charge accumulated by charge storage element 315, floating diffusion element 312 is employed. A voltage change on floating diffusion element 312 is representative of the number of charges in charge storage element 315. An n-type dopant well (n+) in substrate 330 comprises floating diffusion element 312. However, the n+ region can also be placed in a p-well similar to well 316 to reduce parasitic photo charge collection by the n+ region. As noted previously, the charges under charge storage element 315 are minority carriers and thus a relatively complete charge transfer to floating diffusion element 312 can be performed.

Transfer gates 313-314 are employed to selectively shuttle charges in pixel structure 300, such as from finger 311 to charge storage element 315, and from charge storage element 315 to floating diffusion element 312. During an integration phase, transfer gate 314 is activated and transfer gate 313 is inactivated to shuttle charge from finger 311 to charge storage element 315. During a reset phase (i.e. for ambient resilience or anti-blooming), transfer gate 313 is activated and transfer gate 314 is inactivated to drain intervening charge from finger 311 to floating diffusion element 312. This intervening charge is undesired charge accumulated between measurement phases of the pixel structure, such as from ambient light incident to polysilicon finger 311, and transfer gate 313 is activated during the reset phase to drain this undesired charge from polysilicon finger 311 and from diffusion node 312. This reset phase can provide anti-blooming features to pixel structure 300. For example, transfer gates of each pixel of array 371 are operated as noted above to establish a global reset operation of pixel array 371 which clears or drains any latent charge from the associated pixels for more accurate measurement phases. During a pixel read phase, transfer gate 313 and transfer gate 314 are both activated to dump charge stored in charge storage element 315 to floating diffusion element 312 for readout as a voltage. An additional initialization phase (i.e. initial reset of the entire pixel operation) can be employed to ensure a complete reset of both polysilicon finger 311 and charge storage element 315 by activating both transfer gates and shuttling residue charges from both polysilicon finger 311 and charge storage element 315 into diffusion node 312 that is coupled to $V_{dd}$.

Activation or inactivation of each transfer gate can comprise biasing the associated transfer gate to an appropriate voltage level, such as a logic high or logic low, among other voltage levels. These voltage levels can establish potential biases among the elements of A-side structure 310 to shuttle charges as desired. For example, transfer gate 314 might be driven to a relatively high voltage during the integration process to allow charges from 311 to reach charge storage node 315, while transfer gate 313 might be driven to 0V during the integration process to inactivate transfer gate 313 and prevent the dump of charge to diffusion node 312. During readout of the voltage at floating diffusion element 312 by associated output circuitry 333, the voltage that drives transfer gates 313-314 are raised differentially above 0V to allow charge transfer to floating diffusion element 312. It should be understood that the voltages mentioned above are merely exemplary, and appropriate voltages or biases are selected to achieve the desired operation. A further discussion of the operation of transfer gates 313-314 is found in FIG. 4 below.

FIG. 4 includes pixel structure 400 that includes a representative number of elements of pixel structure 300 of FIG. 3. Some elements of FIG. 3 are omitted for clarity. FIG. 4 also shows exemplary output circuitry 461, although different reset and readout elements might instead be included. FIG. 4 shows a 'parallel' arrangement of differential polysilicon fingers in the associated A-side 460 and B-side 462. A-side elements include polysilicon finger 311, floating diffusion element 312, $T_1$ transfer gate 314, $T_2$ transfer gate 313, charge storage element 315, and A-side output circuit 461. A-side output circuit 461 includes reset gate 421, and readout gates 422-423 that form a source-follower arrangement. B-side elements include polysilicon finger 321, floating diffusion element 322, $T_1$ transfer gate 324, $T_2$ transfer gate 323, charge storage element 325. Elements of both A-side 460 and B-side 462 can have shallow trench isolation (STI) barriers (317, 327) formed to establish 'active regions' associated with the various A-side 460 and B-side 462 elements.

Operation of A-side elements is discussed in FIG. 4. However, it should be understood that B-side elements can function similarly, and according to associated differential timing compared to the A-side elements. Output circuitry for B-side 462 is not shown for clarity in FIG. 4. In many examples, operation of A-side elements can be concurrent with operation of B-side elements. Activation table 401 describes various states of $T_1$ transfer gate 314 and $T_2$ transfer gate 313 that control the shuttling of charges among the elements of A-side 460.

In operation '0' (reset, ambient resilience, or anti-bloom operation), latent or intervening charge established by polysilicon finger 311 is dumped to diffusion node 312 for draining to a voltage source. Transfer gate 313 is enabled and transfer gate 314 may be disabled to transfer charge accumulated by polysilicon finger 311 to diffusion node 312. This charge is then converted into a voltage by diffusion node 312 which is then coupled to a voltage source, namely $V_{dd}$, by activation of reset gate 421. The drain operation can be employed in an anti-bloom or ambient-light rejection operation of an imaging sensor to drain away latent ambient charge that is captured in between measurement phases.

During a measurement phase, indicated by operation '1' (integrate/store operation), charges are established in polysilicon finger 311 from incident light, such as that emitted by a modulated light source and reflected by objects in a scene. These charges are stored in charge storage element 315 during an integration period of the measurement phase. During this integration period, transfer gate 313 remains disabled to prevent charges from being dumped to diffusion node 312. Transfer gate 314 can be enabled to allow charges established by polysilicon finger 311 to be transferred to charge storage element 315 for accumulation. In some examples, transfer gate 314 is enabled and disabled in a controlled manner according to activation of an active illumination element, such as shown in FIG. 2.

Once charges have been integrated and stored in charge storage element 315, these charges can be dumped to diffusion node 312 for measurement and use in ToF/imaging applications. Specifically, pixel read operation '2' in FIG. 4 indicates that both transfer gate 314 and 313 are enabled to allow charge stored in charge storage element 315 to be dumped to diffusion node 312. Since diffusion node 312 was previously reset in operation '0' then the charge dumped to diffusion node 312 during operation '3' is generally representative of the charge captured during the integration period. Diffusion node 312 presents a corresponding measurement voltage to output circuit 461, which is read out via enablement of read gate 423.

An additional global initialization phase (i.e. initial reset of the entire pixel operation) can be employed to ensure a complete reset of both polysilicon finger 311 and charge storage element 315 by activating both transfer gates and shuttling residue charges from both polysilicon finger 311 and charge storage element 315 into diffusion node 312 when reset gate 421 is enabled to coupled diffusion node 312 to $V_{dd}$.

In further examples, such as CDS techniques, an additional 'reset' readout can be performed after diffusion node 312 is reset to a 'high' voltage (such as $V_{dd}$), but prior to the dump of charges from charge storage element 315. This reset voltage can be sampled and stored in a capacitor or other suitable storage element, and then subtracted from a pixel measurement voltage (resultant from integrated charge dumped from element 315) for use by compensation or correlation circuitry to provide a more accurate pixel output. To provide this reset voltage, diffusion node 312 is reset by activation of reset gate 421 while transfer gate 313 is disabled, to drain charge from diffusion node 312 to $V_{dd}$. Then, reset gate 421 is deactivated, and a voltage on diffusion node 312 is read out by activation of read gate 423. The reset voltage can be stored in a voltage-domain storage element of a column amplifier circuit, such as a capacitor, after sampling. Then, once the pixel measurement voltage is sampled by dumping of charge to diffusion node 312 from charge storage element 315 using transfer gates 313-314, the reset voltage can be subtracted from the measurement voltage to establish a compensated result that at least partially reduces readout voltage uncertainty of the pixel arrangement, such as discussed above in CDS techniques. This process can occur for both A-side 460 and B-side 462 in FIG. 4.

Advantageously, this enhanced pixel structure can provide for global shutter features in a ToF pixel structure with combined ambient resilience features. This pixel structure includes differential gate fingers (i.e. polysilicon fingers 311 and 321) that are each interfaced with associated two side-by-side transfer gates, one charge-domain storage gate, one diffusion node. The diffusion node is thus behind a first associated transfer gate and the storage gate is behind a second associated transfer gate. This enhanced pixel structure provides for a reduced gate count as well as reduced pixel size and associated interconnect/metallization features. Less metallization and interconnect can reduce parasitic capacitances and power consumption of an associated pixel array. Moreover, a global shutter ToF image sensor can have reduced power consumption due in part to a reduction in ADC circuitry or ADC processing.

FIG. 5 illustrates several differential pixel arrangements, as alternative arrangements to those found in FIGS. 3 and 4, although variations are possible. FIG. 5 includes arrangements 500-503, and further arrangements are possible. Arrangements 500-503 each comprise differential pixel arrangements that can be employed in ToF systems. Individual elements are shaded according to an associated function/type of element, such as floating diffusions, transfer gates, charge storage elements, and imaging cells. These elements can comprise similar elements as discussed above for FIGS. 3 and 4. Each of the pixel arrangements comprises a top view similar to FIG. 3, but with various other pixel array elements, interconnect, and circuitry omitted for clarity and to focus on the individual pixel arrangements.

In pixel arrangement 500, a non-optimal differential pixel arrangement is shown with a first side comprising elements 511-517 and a second side comprising elements 521-527. Pixel arrangement 500 is not as spatially efficient as that shown in FIG. 3 and pixel arrangements 501-503, as an additional transfer gates 516 and 526 are included with additional diffusion nodes 517 and 527. Thus, three transfer gates and two diffusion nodes are included per 'side' of the differential structure. This pixel arrangement 500 employs a more complicated structure and operation. The arrangement in FIG. 3 as well as pixel arrangements 501-503 improve on pixel arrangement 500.

In pixel arrangement 501, a differential pixel arrangement is shown with a first side comprising elements 531-535 and a second side comprising elements 541-545. Only two transfer gates are employed per differential side, as seen in FIG. 3. However, these transfer gates are positioned along a 'long' edge of the imaging cell, with associated charge storage devices and diffusion nodes also arranged in line with the transfer gates. Example STI oxide isolation 537 and 547 are included to establish 'active regions' associated with the elements of pixel arrangement 501. It should be understood that these regions can vary according to manufacturing techniques and operational preferences.

In pixel arrangement 502, a differential pixel arrangement is shown with a first side comprising elements 551-555 and a second side comprising elements 561-565. Two transfer gates are employed per differential side, as seen in FIG. 3. However, these transfer gates are positioned along a 'long' edge of the imaging cell, with associated charge storage devices also arranged in line with the transfer gates. Diffusion nodes are positioned next to an associated one of the transfer gates in a 90-degree rotation from that seen in pixel arrangement 501. Example STI oxide isolation 557 and 567 are included to establish 'active regions' associated with the elements of pixel arrangement 502. It should be understood that these regions can vary according to manufacturing techniques and operational preferences.

In pixel arrangement 503, a differential pixel arrangement is shown with a first side comprising elements 571-575 and a second side comprising elements 581-585. Two transfer gates are employed per differential side, as seen in FIG. 3. However, these transfer gates are positioned along an end of the imaging cell, with associated charge storage devices also arranged in line with the transfer gates. Diffusion nodes are positioned next to an associated one of the transfer gates in a 90-degree rotation from that seen in pixel arrangement 501. Example STI oxide isolation 577 and 587 are included to establish 'active regions' associated with the elements of pixel arrangement 503. It should be understood that these regions can vary according to manufacturing techniques and operational preferences.

FIG. 6 illustrates two pixel arrangements, which might include portions of examples found in FIGS. 3 and 4 and those in FIG. 5. However, instead of focusing on the differential arrangements of pixel structures, FIG. 6 focuses on reduction in metallization, control signaling lines, and interconnect for adjacent pixel structures. Adjacent pixel structures can be included in the same row of a pixel array but are included in different columns of the array. FIG. 6 includes arrangements 600-601, and further arrangements are possible. Arrangements 600-601 each comprise single side pixel arrangements that can be employed in ToF systems, but when coupled with a second 'side' can form a differential pixel arrangement. Individual elements are shaded according to an associated function/type of element, such as floating diffusions, transfer gates, charge storage elements, and imaging cells. These elements can comprise similar elements as discussed above for FIGS. 3 and 4. Each of the pixel arrangements comprises a top view similar to FIG. 3, but with various other pixel array elements, interconnect, and circuitry omitted for clarity and to focus on the individual pixel arrangements.

In pixel arrangement 600, a pixel arrangement is shown with a first pixel 'A' 661 comprising elements 611-615, and a second pixel 'B' 662 comprising elements 621-625. Pixel arrangement 600 includes two adjacent 'odd' and 'even' single side parts of pixels in a same row of a pixel array. In differential pixel examples, only one-half of the differential pixel arrangements are shown for each of first pixel 'A' 661 and second pixel 'B' 662.

Control signaling lines 664-668 are shown for controlling elements of the pixel arrangements. For example, control signaling lines 664-668 can be used to apply biases to coupled gate elements of the pixel arrangements. It should be understood that the routing and layout of lines 664-668 are merely exemplary, and can vary in actual implementations. Control signaling lines 664-666 are multiplexed or shared among similar elements of each pixel, namely transfer gates 614 and 624 share line 664, polysilicon finger elements 611 and 621 share line 665, and transfer gates 613 and 623 share line 666. Control signaling lines 667-668 are shown coupled to associated charge storage elements 615 and 625, and are employed during global shutter operations of a pixel array and to bias charge storage elements 615 and 625 in other operations, such as dumping charge to an associated floating diffusion. Advantageously, only one added signal per each row is needed in this arrangement, and all other pixel signals are shared among the entire rows/columns of the pixel arrays. Each pixel has corresponding read circuitry (such as source follower, reset, and read elements), but each pixel can share the same column amplifier signal line (not shown in the figure). Pixel arrangement 600 can be used to share more pixels that the two shown in pixel arrangement 600 (i.e. 3, 4, 6), and only one added signal is needed per each shared pixel.

In pixel arrangement 601, a pixel arrangement is shown with a first pixel 'A' 671 comprising elements 631-635, and a second pixel 'B' 672 comprising elements 641, and 643-645. Pixel arrangement 601 includes two adjacent 'odd' and 'even' single side parts of pixels in a same row of a pixel array. Control signaling lines can be employed as seen in pixel arrangement 600, however are not shown in pixel arrangement 601 for clarity. Advantageously, as with pixel arrangement 600, only one added signal per each row is needed in this arrangement due to the multiplexing or sharing of control signaling lines.

Additionally, a charge binning feature is shown for the two adjacent odd and even single side parts of the pixels in the same row of the array. This charge binning comprises using shared diffusion node 632. Shared diffusion node 632 can be selectively controlled to concurrently receive charge from both charge storage element 635 and from charge storage element 645, thus providing a charge binning functionality. Two or more pixel structures can share a diffusion node, with the two or more pixel structures proximate to each other so the diffusion node can be positioned to be shared by each pixel structure. Both pixels share the same read circuitry (such as source follower, reset, and read elements), and each pixel can also share the same column amplifier signal line (not shown in the figure). Sharing read circuitry can reduce a part count by at least six (6) gate structures for a ToF pixel. The differential nature of ToF pixels will typically limit pixel arrangement 601 to only two pixels sharing the same diffusion node and read circuitry (i.e. 2×1 charge binning and 2×1 read circuit gate sharing). Further structures and arrangements can be employed for 4×4 charge binning. The 2×1 charge binning where the diffusion node is shared between neighboring pixels can increase the signal to noise ratio by at least 1.41 for associated pixels over analog binning with separate diffusion nodes or digital binning with separate diffusion nodes.

The multiplexing reading/selecting scheme shown in pixel arrangements 600-601 in FIG. 6 provide readout for pixels in a same row into one shared column amplifier circuit. Moreover, this scheme only requires one added metal wire signal per row for each shared global shutter charge storage element. For example, 2 wires are needed for sharing 2 pixels, 4 wires are needed for sharing 4 pixels, and so on. Other signaling for controlling operation of transfer gates, reset circuitry, read circuitry, and imaging cell/polysilicon fingers can be shared among the pixels of the same column or same row.

Figure 7:
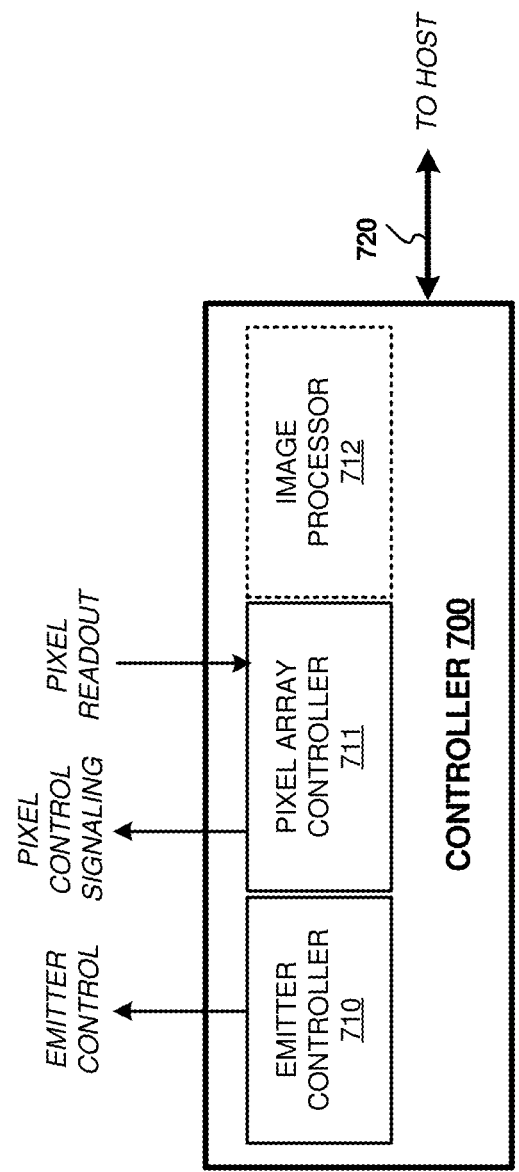
FIG. 7 illustrates an example controller suitable for implementing any of the architectures, processes, methods, and operational scenarios disclosed herein.

FIG. 7 illustrates controller 700 that is representative of any system or collection of systems in which the various time-of-flight detection, pixel control, pixel timing, and image processing operational architectures, scenarios, and processes disclosed herein may be implemented. For example, controller 700 can be employed in ToF processing circuitry 122 of FIG. 1, controller 212 of FIG. 2, pixel control circuitry 372/333 of FIG. 3, or output circuitry 461 of FIG. 4. Examples of controller 700 can be incorporated into further devices and systems, such as virtual reality devices, augmented reality devices, gaming consoles, camera devices, smartphone cameras, discrete camera devices, ToF cameras, laptop computers, tablet computers, desktop computers, servers, cloud computing platforms, hybrid computers, virtual machines, smart televisions, smart watches and other wearable devices, as well as any variation or combination thereof.

Controller 700 may be implemented as a single apparatus, system, or device or may be implemented in a distributed manner as multiple apparatuses, systems, or devices. For example, controller 700 can comprise one or more application-specific integrated circuits (ASICs), field-programmable gate arrays (FPGA), or discrete logic and associated circuitry, including combinations thereof. Although not shown in FIG. 7, controller 700 can include communication interfaces, network interfaces, user interfaces, and other elements for communicating with a host system over communication link 720. Computing system 701 may optionally include additional devices, features, or functionality not discussed for purposes of brevity.

Controller 700 can also comprise one or more microcontrollers or microprocessors with software or firmware included on computer-readable storage media devices. If software or firmware is employed, the computer-readable storage media devices may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

Controller 700 includes various controller portions to enhance time-of-flight sensing, namely emitter controller 710, pixel array controller 711, and optional image processor 712. Emitter controller 710 provides timing of emission of light to be synchronized with measurement of light by pixels, and typically operates in conjunction with pixel array controller 711. In some examples, emitter controller 710 provides RF modulator control signaling to indicate an RF modulation frequency and phase to RF modulator circuitry and to pixel array controller 711. Pixel array controller 711 provides pixel control signaling to control the pixel structures discussed herein, whether the pixels are individual pixels or included in an array of pixels. Specifically, pixel array controller 711 provides for resetting pixel areas for measurement of light, controlling transfer gates to transfer charge to shared diffusion nodes, and time multiplexing readout of pixels, among other operations. Pixel array controller 711 provides for receiving pixel readout and providing pixel readout information to optional image processor 712. Image processor 712 provides for accumulating pixel data for an array of pixels to create 3D and 2D images and providing associated ToF information or 3D/2D image data to a host system over communication link 720. Image processor 712 also processes ToF information generated by ToF pixels to form 3D digital images, such as depth map digital images, and form 2D digital images, such as infrared light images, among other operations. When image processor 712 is omitted, pixel array controller 711 can provide pixel readout data to a host system over communication link 720. In some examples, pixel array controller 711 controls or includes an analog-to-digital conversion circuit to convert pixel readout signals to digital formats.

Certain inventive aspects may be appreciated from the foregoing disclosure, of which the following are various examples.

Example 1

A pixel arrangement, comprising a sensing element configured to accumulate charges related to incident light, and two transfer gates proximate to the sensing element and configured to selectively control transfer of the charges in the pixel arrangement. During an integration phase, a charge storage element for a global shutter is configured to store first ones of the charges received from the sensing element based at least on activation of a first transfer gate of the two transfer gates and inactivation of a second transfer gate of the two transfer gates. During a reset phase, a diffusion node is configured to receive second ones of the charges received from the sensing element based at least on inactivation of the first transfer gate and activation of the second transfer gate for draining of the second ones of the charges to a voltage source. During a pixel readout phase, the diffusion node is configured to receive the first ones of the charges received from the charge storage element based at least on activation of the first transfer gate and activation of the second transfer gate and present a pixel readout voltage representative of the first ones of the charges dumped to the diffusion node.

Example 2

The pixel arrangement of Example 1, where during the pixel readout phase, the activation of the first transfer gate and the second transfer gate comprises establishing a transfer potential between the charge storage element and the diffusion node to dump the first ones of the charges stored at the charge storage element to the diffusion node.

Example 3

The pixel arrangement of Examples 1-2, where a column amplifier is shared among the pixel arrangement in a first column of a pixel array and a further pixel arrangement in a second column of the array, where individual control signaling lines for at least the first transfer gate, the second transfer gate, and the sensing element are shared among the pixel arrangement and corresponding elements of the further pixel arrangement, and where a control signaling line for the charge storage element of the pixel arrangement is separate from a control signaling line for a charge storage element of the further pixel arrangement.

Example 4

The pixel arrangement of Examples 1-3, where the diffusion node is shared among the pixel arrangement and at least a further pixel arrangement proximate to the pixel arrangement, and where a charge binning operation is selectively performed based on at least the diffusion node concurrently receiving the first ones of the charges from the charge storage element of the pixel arrangement and further charges from at least a charge storage element of the further pixel arrangement.

Example 5

The pixel arrangement of Examples 1-4 where during the reset phase, the activation of the second transfer gate comprises establishing a transfer potential between the sensing element and the diffusion node to dump the second ones of the charges stored at the charge storage element to the diffusion node, and where during the reset phase, the inactivation of the first transfer gate comprises establishing a blocking potential between the sensing element and the charge storage element that substantially inhibits transfer of the second ones of the charges to the charge storage element.

Example 6

The pixel arrangement of Examples 1-5, comprising during a global pixel initialization phase, the diffusion node configured to receive third ones of the charges from both the charge storage element and the sensing element based at least on activation of the first transfer gate and activation of the second transfer gate for draining of the third ones of the charges to a voltage source.

Example 7

The pixel arrangement of Examples 1-6, comprising after the reset phase, based at least on inactivation of the second transfer gate, the diffusion node configured to present a reset voltage for readout into a capacitor for subtraction from the pixel readout voltage presented by the diffusion node during the pixel readout phase to establish a compensated result that at least partially reduces readout voltage uncertainty of the pixel arrangement.

Example 8

The pixel arrangement of Examples 1-7, where the charge storage element comprises at least one metal-oxide-semiconductor capacitor element formed with an underlying p-type dopant well in a semiconductor substrate associated with the pixel arrangement, where the p-type dopant well comprises a higher p-type doping level than the semiconductor substrate.

Example 9

A pixel array, comprising a semiconductor substrate, an array of pixel structures for sensing at least incident light, and output circuitry configured to establish pixel outputs based at least on voltages read from the array of pixel structures. Where each of the pixel structures comprise a sensing element configured to establish charges related to incident light, and two transfer gates proximate to the sensing element and configured to selectively control transfer of the charges. During an integration phase, a charge storage element for a global shutter is configured to store first ones of the charges received from the sensing element based at least on activation of a first transfer gate of the two transfer gates and inactivation of a second transfer gate of the two transfer gates. During a reset phase, a diffusion node is configured to receive second ones of the charges received from the sensing element based at least on inactivation of the first transfer gate and activation of the second transfer gate for draining of the second ones of the charges to a voltage source. During a pixel readout phase, the diffusion node is configured to receive the first ones of the charges received from the charge storage element based at least on activation of the first transfer gate and activation of the second transfer gate and present a pixel readout voltage representative of the first ones of the charges dumped to the diffusion node.

Example 10

The pixel array of Example 9, where during the pixel readout phase, activation of the first transfer gate and the second transfer gate comprises establishing a transfer potential between the charge storage element and the diffusion node to dump the first ones of the charges stored at the charge storage element to the diffusion node.

Example 11

The pixel array of Examples 9-10, where during the reset phase, the activation of the second transfer gate comprises establishing a transfer potential between the sensing element and the diffusion node to dump the second ones of the charges stored at the charge storage element to the diffusion node, and where during the reset phase, the inactivation of the first transfer gate comprises establishing a blocking potential between the sensing element and the charge storage element that substantially inhibits transfer of the second ones of the charges to the charge storage element.

Example 12

The pixel array of Examples 9-11, comprising during a global pixel initialization phase, the diffusion node configured to receive third ones of the charges from both the charge storage element and the sensing element based at least on activation of the first transfer gate and activation of the second transfer gate for draining of the third ones of the charges to the voltage source.

Example 13

The pixel array of Examples 9-12, comprising after the reset phase, based at least on inactivation of the second transfer gate, the diffusion node configured to present a reset voltage for readout into a capacitor for subtraction from the pixel readout voltage presented by the diffusion node during the pixel readout phase to establish a compensated result that at least partially reduces readout voltage uncertainty of the pixel arrangement.

Example 14

The pixel array of Examples 9-13, where the charge storage element comprises at least one metal-oxide-semiconductor capacitor element formed with an underlying p-type dopant well in the semiconductor substrate, where the p-type dopant well comprises a higher p-type doping level than the semiconductor substrate.

Example 15

The pixel array of Examples 9-14, where a first pixel structure is associated with a first column of the array of pixel structures, and a second pixel structure is associated with a second column of the array of pixel structures, where individual control signaling lines for at least a first transfer gate, a second transfer gate, and a sensing element are shared among the first pixel structure and corresponding elements of the second pixel arrangement, and where a control signaling line for the charge storage element of the first pixel structure is separate from a control signaling line for a charge storage element of the second pixel structure.

Example 16

The pixel array of Examples 9-15, where a shared diffusion node is common among a first pixel structure and at least a second pixel structure proximate to the first pixel structure, and where a charge binning operation is selectively performed based on at least the shared diffusion node concurrently receiving first charges from a charge storage element of the first pixel structure and further charges from at least a charge storage element of the second pixel structure.

Example 17

A method of operating a pixel arrangement, the method comprising accumulating charges related to incident light in at least one sensing element. The method includes, during an integration phase, in at least one charge storage element for a global shutter, storing first ones of the charges received from the at least one sensing element based at least on activation of a first transfer gate proximate to the at least one sensing element and inactivation of a second transfer gate proximate to the at least one sensing element. The method includes, during a reset phase, in at least one diffusion node, receiving second ones of the charges received from the at least one sensing element based at least on inactivation of the first transfer gate and activation of the second transfer gate for draining of the second ones of the charges to a voltage source. The method includes, during a pixel readout phase, in the at least one diffusion node, receiving the first ones of the charges received from the charge storage element based at least on activation of the first transfer gate and activation of the second transfer gate.

Example 18

The method of Example 17, where the pixel arrangement is associated with a first column of an array that incorporates the pixel arrangement; and the method further comprising during the pixel readout phase, in the at least one diffusion node, presenting a pixel readout voltage to a column amplifier shared among the pixel arrangement and a further pixel arrangement in a different column of the array than the pixel arrangement.

Example 19

The method of Examples 17-18, where during the reset phase, the activation of the second transfer gate comprises establishing a transfer potential between the at least one sensing element and the at least one diffusion node to dump the second ones of the charges stored at the charge storage element to the at least one diffusion node, and where during the reset phase, the inactivation of the first transfer gate comprises establishing a blocking potential between the at least one sensing element and the at least one charge storage element that substantially inhibits transfer of the second ones of the charges to the at least one charge storage element.

Example 20

The method of Examples 17-19, the method further comprising during a global pixel initialization phase, in the at least one diffusion node, receiving third ones of the charges from both the charge storage element and the at least one sensing element based at least on activation of the first transfer gate and activation of the second transfer gate for draining of the third ones of the charges to the voltage source.

The terms "visible light" and "infrared light" (IR light) are discussed herein. Visible light typically comprises wavelengths of light that correspond to the visible range of a human eye, approximately wavelengths 390 nanometers (nm) to 700 nm. IR light comprises wavelengths of light that extend from approximately 700 nanometers to 1 millimeter (mm). Variations of wavelength ranges are possible, but in general visible light and IR light discussed herein refer to the above approximate ranges.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the disclosure. Those skilled in the art will also appreciate that the features described above can be combined in various ways to form multiple implementations. As a result, the invention is not limited to the specific implementations described above, but only by the claims and their equivalents.

What is claimed is:

1. A pixel arrangement, comprising:
   a sensing element configured to accumulate charges related to incident light;
   two transfer gates proximate to the sensing element and configured to selectively control transfer of the charges in the pixel arrangement;
   during an integration phase, a charge storage element for a global shutter configured to store first ones of the charges received from the sensing element based at least on activation of a first transfer gate of the two transfer gates and inactivation of a second transfer gate of the two transfer gates;
   during a reset phase, a diffusion node configured to receive second ones of the charges received from the sensing element based at least on inactivation of the first transfer gate and activation of the second transfer gate for draining of the second ones of the charges to a voltage source; and
   during a pixel readout phase, the diffusion node configured to receive the first ones of the charges received from the charge storage element based at least on activation of the first transfer gate and activation of the second transfer gate and present a pixel readout voltage representative of the first ones of the charges dumped to the diffusion node.

2. The pixel arrangement of claim 1, wherein during the pixel readout phase, the activation of the first transfer gate and the second transfer gate comprises establishing a transfer potential between the charge storage element and the diffusion node to dump the first ones of the charges stored at the charge storage element to the diffusion node.

3. The pixel arrangement of claim 1, wherein a column amplifier is shared among the pixel arrangement in a first column of a pixel array and a further pixel arrangement in a second column of the array;
   wherein individual control signaling lines for at least the first transfer gate, the second transfer gate, and the sensing element are shared among the pixel arrangement and corresponding elements of the further pixel arrangement; and
   wherein a control signaling line for the charge storage element of the pixel arrangement is separate from a control signaling line for a charge storage element of the further pixel arrangement.

4. The pixel arrangement of claim 1, wherein the diffusion node is shared among the pixel arrangement and at least a further pixel arrangement proximate to the pixel arrangement; and
   wherein a charge binning operation is selectively performed based on at least the diffusion node concurrently receiving the first ones of the charges from the charge storage element of the pixel arrangement and further charges from at least a charge storage element of the further pixel arrangement.

5. The pixel arrangement of claim 1, wherein during the reset phase, the activation of the second transfer gate comprises establishing a transfer potential between the sensing element and the diffusion node to dump the second ones of the charges stored at the charge storage element to the diffusion node; and
   wherein during the reset phase, the inactivation of the first transfer gate comprises establishing a blocking potential between the sensing element and the charge storage element that substantially inhibits transfer of the second ones of the charges to the charge storage element.

6. The pixel arrangement of claim 1, comprising:
during a global pixel initialization phase, the diffusion node configured to receive third ones of the charges from both the charge storage element and the sensing element based at least on activation of the first transfer gate and activation of the second transfer gate for draining of the third ones of the charges to a voltage source.

7. The pixel arrangement of claim 1, comprising:
after the reset phase, based at least on inactivation of the second transfer gate, the diffusion node configured to present a reset voltage for readout into a capacitor for subtraction from the pixel readout voltage presented by the diffusion node during the pixel readout phase to establish a compensated result that at least partially reduces readout voltage uncertainty of the pixel arrangement.

8. The pixel arrangement of claim 1, wherein the charge storage element comprises at least one metal-oxide-semiconductor capacitor element formed with an underlying p-type dopant well in a semiconductor substrate associated with the pixel arrangement, wherein the p-type dopant well comprises a higher p-type doping level than the semiconductor substrate.

9. A pixel array, comprising:
a semiconductor substrate;
an array of pixel structures for sensing at least incident light; and
output circuitry configured to establish pixel outputs based at least on voltages read from the array of pixel structures;
wherein each of the pixel structures comprise:
a sensing element configured to establish charges related to incident light;
two transfer gates proximate to the sensing element and configured to selectively control transfer of the charges;
during an integration phase, a charge storage element for a global shutter configured to store first ones of the charges received from the sensing element based at least on activation of a first transfer gate of the two transfer gates and inactivation of a second transfer gate of the two transfer gates;
during a reset phase, a diffusion node configured to receive second ones of the charges received from the sensing element based at least on inactivation of the first transfer gate and activation of the second transfer gate for draining of the second ones of the charges to a voltage source; and
during a pixel readout phase, the diffusion node configured to receive the first ones of the charges received from the charge storage element based at least on activation of the first transfer gate and activation of the second transfer gate and present a pixel readout voltage representative of the first ones of the charges dumped to the diffusion node.

10. The pixel array of claim 9, wherein during the pixel readout phase, activation of the first transfer gate and the second transfer gate comprises establishing a transfer potential between the charge storage element and the diffusion node to dump the first ones of the charges stored at the charge storage element to the diffusion node.

11. The pixel array of claim 9, wherein during the reset phase, the activation of the second transfer gate comprises establishing a transfer potential between the sensing element and the diffusion node to dump the second ones of the charges stored at the charge storage element to the diffusion node; and
wherein during the reset phase, the inactivation of the first transfer gate comprises establishing a blocking potential between the sensing element and the charge storage element that substantially inhibits transfer of the second ones of the charges to the charge storage element.

12. The pixel array of claim 9, comprising:
during a global pixel initialization phase, the diffusion node configured to receive third ones of the charges from both the charge storage element and the sensing element based at least on activation of the first transfer gate and activation of the second transfer gate for draining of the third ones of the charges to the voltage source.

13. The pixel array of claim 9, comprising:
after the reset phase, based at least on inactivation of the second transfer gate, the diffusion node configured to present a reset voltage for readout into a capacitor for subtraction from the pixel readout voltage presented by the diffusion node during the pixel readout phase to establish a compensated result that at least partially reduces readout voltage uncertainty of the pixel arrangement.

14. The pixel array of claim 9, wherein the charge storage element comprises at least one metal-oxide-semiconductor capacitor element formed with an underlying p-type dopant well in the semiconductor substrate, wherein the p-type dopant well comprises a higher p-type doping level than the semiconductor substrate.

15. The pixel array of claim 9, wherein a first pixel structure is associated with a first column of the array of pixel structures, and a second pixel structure is associated with a second column of the array of pixel structures;
wherein individual control signaling lines for at least a first transfer gate, a second transfer gate, and a sensing element are shared among the first pixel structure and corresponding elements of the second pixel arrangement; and
wherein a control signaling line for the charge storage element of the first pixel structure is separate from a control signaling line for a charge storage element of the second pixel structure.

16. The pixel array of claim 9, wherein a shared diffusion node is common among a first pixel structure and at least a second pixel structure proximate to the first pixel structure; and
wherein a charge binning operation is selectively performed based on at least the shared diffusion node concurrently receiving first charges from a charge storage element of the first pixel structure and further charges from at least a charge storage element of the second pixel structure.

17. A method of operating a pixel arrangement, the method comprising:
accumulating charges related to incident light in at least one sensing element;
during an integration phase, in at least one charge storage element for a global shutter, storing first ones of the charges received from the at least one sensing element based at least on activation of a first transfer gate proximate to the at least one sensing element and inactivation of a second transfer gate proximate to the at least one sensing element;
during a reset phase, in at least one diffusion node, receiving second ones of the charges received from the at least one sensing element based at least on inactivation of the first transfer gate and activation of the second transfer gate for draining of the second ones of the charges to a voltage source; and during a pixel readout phase, in the at least one diffusion node, receiving the first ones of the charges received from the charge storage element based at least on activation of the first transfer gate and activation of the second transfer gate.

18. The method of claim 17, wherein the pixel arrangement is associated with a first column of an array that incorporates the pixel arrangement; and the method further comprising:

during the pixel readout phase, in the at least one diffusion node, presenting a pixel readout voltage to a column amplifier shared among the pixel arrangement and a further pixel arrangement in a different column of the array than the pixel arrangement.

19. The method of claim 17, wherein during the reset phase, the activation of the second transfer gate comprises establishing a transfer potential between the at least one sensing element and the at least one diffusion node to dump the second ones of the charges stored at the charge storage element to the at least one diffusion node; and wherein during the reset phase, the inactivation of the first transfer gate comprises establishing a blocking potential between the at least one sensing element and the at least one charge storage element that substantially inhibits transfer of the second ones of the charges to the at least one charge storage element.

20. The method of claim 17, the method further comprising:

during a global pixel initialization phase, in the at least one diffusion node, receiving third ones of the charges from both the charge storage element and the at least one sensing element based at least on activation of the first transfer gate and activation of the second transfer gate for draining of the third ones of the charges to the voltage source.

* * * * *